(12) United States Patent
Lee

(10) Patent No.: US 7,700,401 B2
(45) Date of Patent: Apr. 20, 2010

(54) IMAGE SENSOR AND METHOD FOR MANUFACTURING THE SAME

(75) Inventor: Min Hyung Lee, Cheongjoo-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 35 days.

(21) Appl. No.: 11/842,787

(22) Filed: Aug. 21, 2007

(65) Prior Publication Data

US 2008/0283881 A1 Nov. 20, 2008

(30) Foreign Application Priority Data

May 17, 2007 (KR) ........................ 10-2007-0047885

(51) Int. Cl.
*H01L 21/00* (2006.01)
(52) U.S. Cl. .......................... 438/98; 438/96; 438/629; 257/292
(58) Field of Classification Search .................. 438/74, 438/96, 627, 629, 72, 98; 257/292
See application file for complete search history.

(56) References Cited

U.S. PATENT DOCUMENTS 6,130,157 A * 10/2000 Liu et al. .................... 438/669
6,995,411 B2 2/2006 Yaung et al.
7,498,188 B2 * 3/2009 Fan et al. .................... 438/60
2006/0113675 A1 * 6/2006 Chang et al. ................ 257/763
2008/0079102 A1 * 4/2008 Chen et al. .................. 257/431

FOREIGN PATENT DOCUMENTS

| CN | 1783478 A | 6/2006 |
| JP | 2000156488 | 6/2000 |
| KR | 10-2005-0062810 | 1/2007 |

OTHER PUBLICATIONS

U.S. Appl. No. 11/842,831, filed Aug. 21, 2007; Inventor: Min Hyung Lee (currently pending claims provided); Publication No. US-2008-0224138-A1; published Sep. 18, 2008.

* cited by examiner

*Primary Examiner*—Zandra Smith
*Assistant Examiner*—Christy L Novacek
(74) *Attorney, Agent, or Firm*—Saliwanchik, Lloyd & Saliwanchik

(57) ABSTRACT

An image sensor according to one embodiment of the present invention includes a semiconductor substrate having a CMOS circuit formed therein; an interlayer dielectric layer formed on the semiconductor substrate and including a trench formed therein; a metal wiring and a first conductive layer formed within the trench of the interlayer dielectric layer; an intrinsic layer formed on the semiconductor substrate including the first conductive layer and the interlayer dielectric layer; and a second conductive layer formed on the intrinsic layer.

11 Claims, 5 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0047885, filed May 17, 2007, which is hereby incorporated by reference in its entirety.

BACKGROUND

An image sensor, which is a semiconductor device that converts an optical image into an electrical signal, is largely classified as a charge coupled device (CCD) image sensor or a Complementary Metal Oxide Semiconductor (CMOS) image sensor.

The CMOS image sensor sequentially detects electrical signals of respective unit pixels in a switching scheme by utilizing photodiodes and MOS transistors in unit pixels, thereby displaying an image.

A CMOS image sensor can include a photodiode region for receiving a light signal to convert it into an electrical signal and a transistor region for processing the electrical signal.

The typical CMOS image sensor has a structure where the photodiode and the transistor are horizontally arranged.

Many disadvantages of the CCD image sensor are addressed by the horizontal type image sensor; however, there are still problems associated with the horizontal type image sensor.

In particular, the photodiode and the transistor of a horizontal type image sensor are formed to be horizontally adjacent to each other on a substrate. Accordingly, an additional region of the substrate for forming the photodiode is required for each unit pixel so that the region of a fill factor is reduced and the resolution may be limited.

In addition, according to the horizontal type image sensor, it can be very difficult to achieve the optimization for a process simultaneously manufacturing the photodiode and the transistor. For example, a shallow junction is required for a low sheet resistance in a rapid transistor process; however, such a shallow junction may not be appropriate for the photodiode.

To add additional on-chip functions to the horizontal type CMOS image sensor, the size of a unit pixel may need to be increased or decreased, depending on circumstances, in order to maintain sensitivity of the horizontal type CMOS image sensor.

However, when the size of the unit pixel is increased, the resolution of the horizontal type CMOS image sensor is decreased. In addition, when the area of the photodiode is decreased, the sensitivity of the horizontal type CMOS image sensor is decreased.

BRIEF SUMMARY

Embodiments of the present invention provide an image sensor and a method for manufacturing the same vertically integrating a transistor circuit and a photodiode.

The image sensor according to an embodiment includes a semiconductor substrate having a CMOS circuit formed therein; an interlayer dielectric layer formed on the semiconductor substrate and including a trench; a metal wiring and a first conductive layer formed within the trench of the interlayer dielectric layer; an intrinsic layer formed on the semiconductor substrate including the first conductive layer and the interlayer dielectric layer; and a second conductive layer formed on the intrinsic layer.

Also, a method for manufacturing the image sensor according to an embodiment includes forming an interlayer dielectric layer including a trench on a semiconductor substrate having a CMOS circuit formed therein; forming a metal wiring and a first conductive layer in the inside of the trench of the interlayer dielectric layer; forming an intrinsic layer on the semiconductor substrate including the first conductive layer and the interlayer dielectric layer; and forming a second conductive layer on the intrinsic layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to certain embodiments of the present invention, examples of which are illustrated in the accompanying drawings. Wherever possible, the same reference numbers will be used throughout the drawings to refer to the same or like parts.

Figure 8:
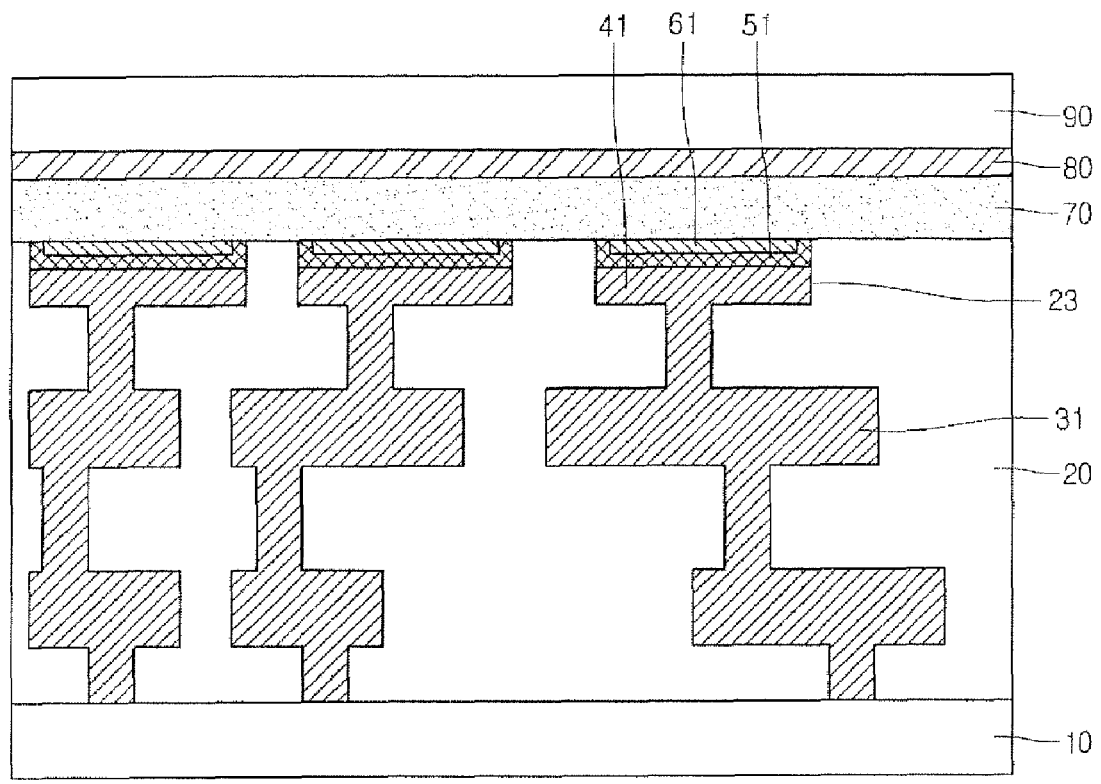

FIG. 8 is a cross-sectional view of an image sensor according to an embodiment.

The image sensor includes a semiconductor substrate 10 having a CMOS circuit formed therein and an interlayer dielectric layer 20 including a trench 23 formed on the semiconductor substrate 10. The interlayer dielectric layer 20 can include multiple metal wiring layers below the trench 23. A metal wiring 41 and a conductive barrier film 51 can be formed in the inside of the trench 23 of the interlayer dielectric layer 20. A first conductive layer 61 can be formed on the conductive barrier film 51 in the inside of the trench 23, and an intrinsic layer 70 can be formed on the semiconductor substrate 10 including the first conductive layer 61 and the interlayer dielectric layer 20. A second conductive layer 80 can be formed on the intrinsic layer 70 to complete a photodiode structure involving the first conductive layer 61, the intrinsic layer 70, and the second conductive layer 80.

The metal wiring 41 can be formed of copper. The metal wiring 41 can be a final wiring or can be used as a lower electrode.

The metal wiring 41, the conductive barrier film 51 and the first conductive layer 61 are positioned in the inside of the trench 23 of the interlayer dielectric layer 20. The upper surface of the first conductive layer 61 and the interlayer dielectric layer are formed at the same height so that the metal wiring 41 and the first conductive layer 61 are isolated by the interlayer dielectric layer 20 per unit pixel.

The conductive barrier film 51 can be formed of, for example, at least any one of Ta, Ti, TaN, TiN, TiSiN, TiW, TaW and TaSiN to inhibit the copper of the metal wiring 41 from diffusing to the first conductive layer 61.

Hereinafter, a method for manufacturing an image sensor according to an embodiment will be described with reference to FIGS. 1 to 8.

Figure 1:
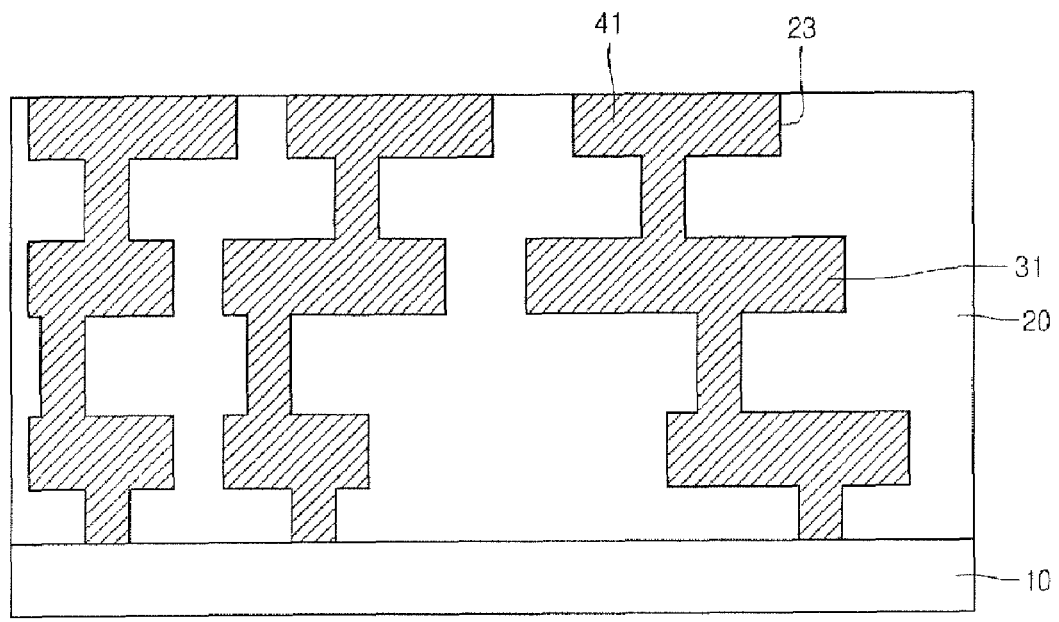
FIGS. 1 to 8 are views showing a process for manufacturing an image sensor according to an embodiment of the present invention.

Referring to FIG. 1, an interlayer dielectric layer 20 including metal wirings 31 and 41 is formed on a semiconductor substrate 10 having a circuit region (not shown) formed therein.

Although not shown, a device isolation film defining an active region and a field region is formed in the semiconductor substrate 10, and a CMOS circuit incorporating, for example, a transfer transistor, a reset transistor, a drive transistor and a select transistor for each unit pixel can be formed.

The interlayer dielectric layer 20 can be formed of multiple layers above the CMOS circuit, and can include a plurality of metal layers for connecting the CMOS circuit to a power line or a signal line.

As illustrated in the figures, the interlayer dielectric layer 20 can be formed of a plurality of layers, and a plurality of metal wirings, such as wirings 31 and 41, can be formed in the interlayer dielectric layer 20.

The metal wirings 31 and 41 are disposed per unit pixel to connect the CMOS circuit to the photodiode. The formation and detail of the metal wirings are known in the art.

For example, the metal wirings 31 and 41 can be formed of various conductive materials including metal, alloy or silicide. In various embodiments, the metal wirings 31 and 41 can be formed of, for example, aluminum, copper, cobalt or tungsten. The barrier metal layer can be optional depending on the material of the metal wirings.

Of interest in the image sensor according to the present invention is the top, or final, metal wiring 41 formed on the interlayer dielectric layer 20. In particular, the metal wiring 41 can be used as a lower electrode for the photodiode or a lower electrode can separately be formed on the metal wiring 41.

According to an embodiment, the metal wiring 41 can be formed by gap-filling copper into a trench 23 formed in the interlayer dielectric layer 20 using, for example, an electrical plating process.

Although not shown, copper seed layers can sequentially be formed to easily perform the gap-filling of the copper, and a barrier metal layer for preventing the diffusion of the copper can be deposited before gap-filling a copper layer within the trench 23.

Figure 2:
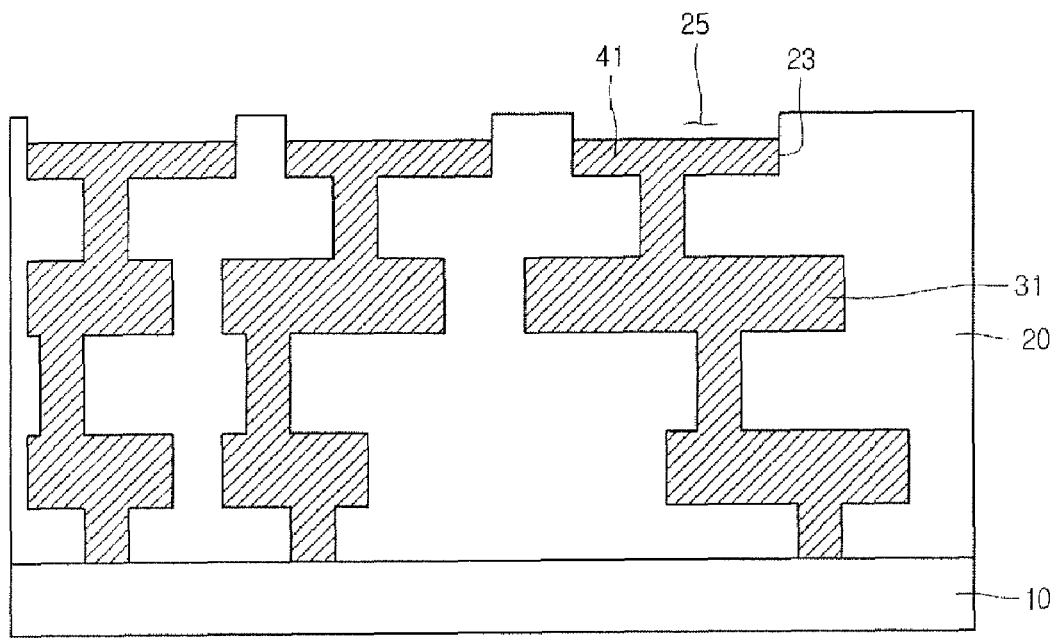

Referring to FIG. 2, a recess groove 25 is formed in the trench 23 having the metal wiring 41 therein.

The recess groove 25 is formed to be lower in height as compared to the interlayer dielectric layer 20 by means of a recess process for the metal wiring 41 in the inside of the trench 23.

In other words, the metal wiring 41 can be etched to a predetermined depth so that the surface of the interlayer dielectric layer 20 and the surface of the metal wiring 41 have a difference in height. Therefore, the trench 23 of the interlayer dielectric layer 20 having the metal wiring 41 therein is provided with the recess groove 25.

The recess process for the metal wiring 41 can be a wet etching process. For example, the metal wiring 41 can be etched by means of an etching solution of $H_2O_2$ and $H_2SO_4$. In an embodiment, the metal wiring 41 can be etched so that the difference in height between the upper surface of the interlayer dielectric layer 20 and the upper surface of the metal wiring 41 is about 500 to 1,500 Å.

In another embodiment, the recess process for the metal wiring 41 can be a chemical mechanical polishing CMP process. For example, when performing the CMP process for the metal wiring 41, the interlayer dielectric layer 20 is used as an etch stopping layer, and the copper layer formed in the trench 23 can be excessively grinded as compared to the interlayer dielectric layer 20 by means of the control of the CMP process so that the end difference between the upper surface of the interlayer dielectric layer 20 and the upper surface of the metal wiring 41 can be about 500 to 1,500 Å.

Accordingly, the inside of the trench 23 of the interlayer dielectric layer 20 having the metal wiring 41 therein can be provided with the recess groove 25 by the selected recess process. In one embodiment, the metal wiring 41 can be completely removed from the trench 23.

Figure 3A:
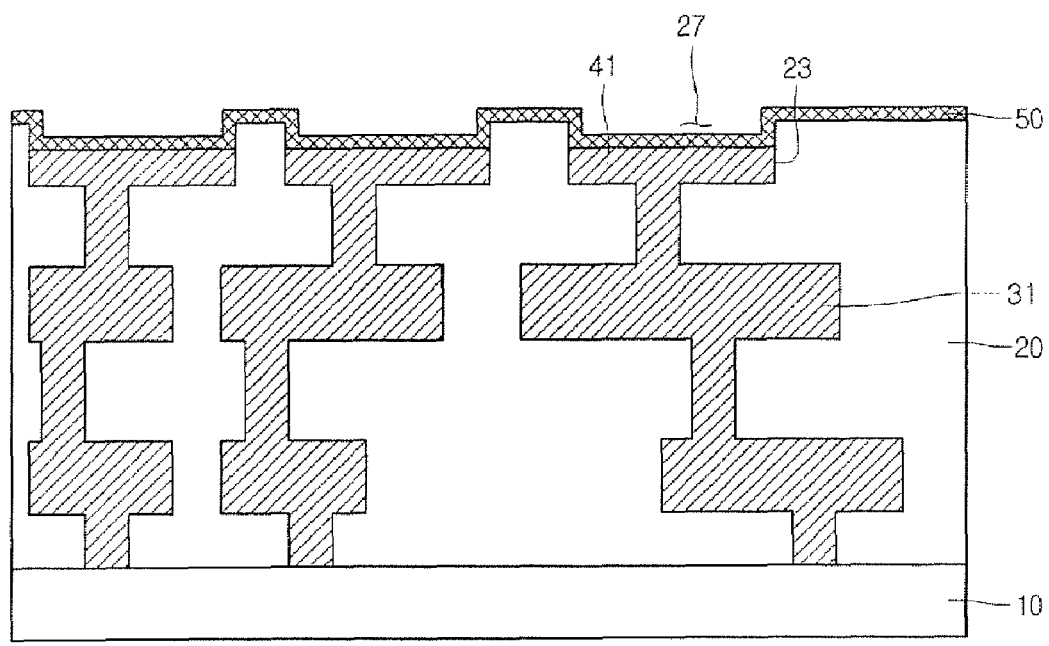

Referring to FIG. 3A, an optional conductive barrier film 50 can be formed on the interlayer dielectric layer 20 having the recess groove 25 therein.

The conductive barrier film 50 can be formed to cover the metal wiring 41 and fill a portion of the recess groove 25 of the interlayer dielectric layer 20. For example, the conductive barrier film 50 can be formed by depositing at least one of Ta, Ti, TaN, TiN, TiSiN, TiW, TaW and TaSiN. The conductive barrier film 50 can be deposited using a physical vapor deposition (PVD), chemical vapor deposition (CVD) or atomic layer deposition (ALD) method. The conductive barrier film 50 can be formed to a thickness of, for example, 50-200 Å when the recess groove has a depth of about 500-1500 Å.

Although the conductive barrier film 50 is formed on the interlayer dielectric layer 20, the conductive barrier film 50 is formed in a thin thickness so that the trench 23 of the interlayer dielectric layer 20 remains provided with a recess groove 27.

Figure 3B:
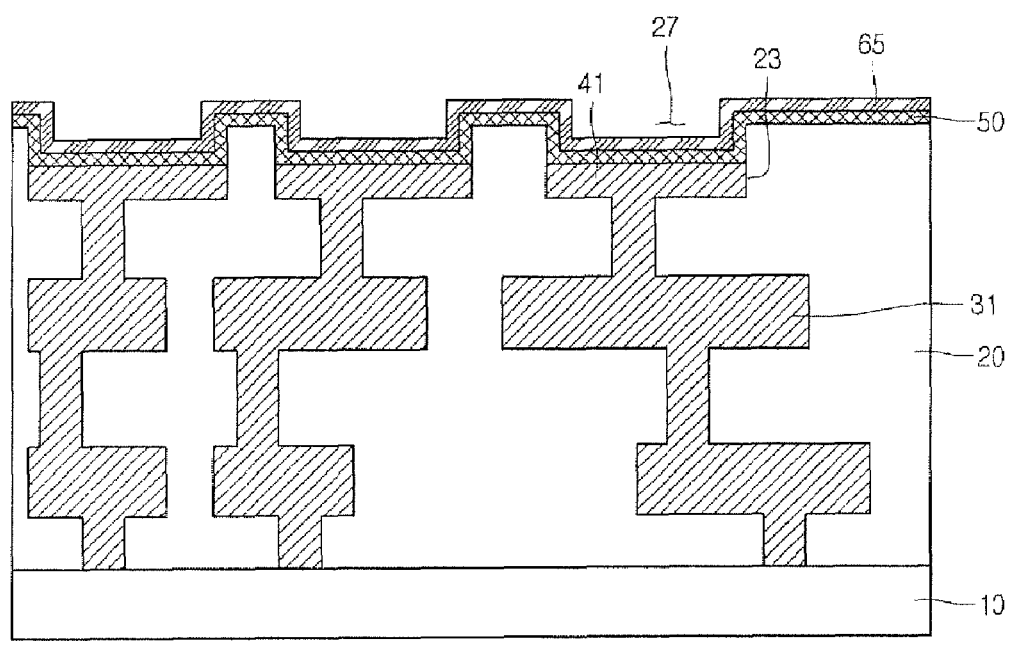

Referring to FIG. 3B, after optionally forming the conductive barrier film 50, in one embodiment, a lower electrode layer 65 can be formed on the interlayer dielectric layer 20. For example, the lower electrode layer 65 can be formed of a metal such as Cr, Ti, TiW, and Ta. Of course, the lower electrode layer 65 can be not formed as shown in FIG. 4.

Although the lower electrode layer 65 is formed on the conductive barrier film 50, the conductive barrier film 50 and the lower electrode layer 65 are formed in a thin thickness so that the trench 23 of the interlayer dielectric layer 20 remains provided with the recess groove 27.

Embodiments where the lower electrode layer 65 is not formed will be described with the reference to FIGS. 4 to 7, but the processes can be performed in a similar fashion for embodiments incorporating the lower electrode layer 65.

Figure 4:
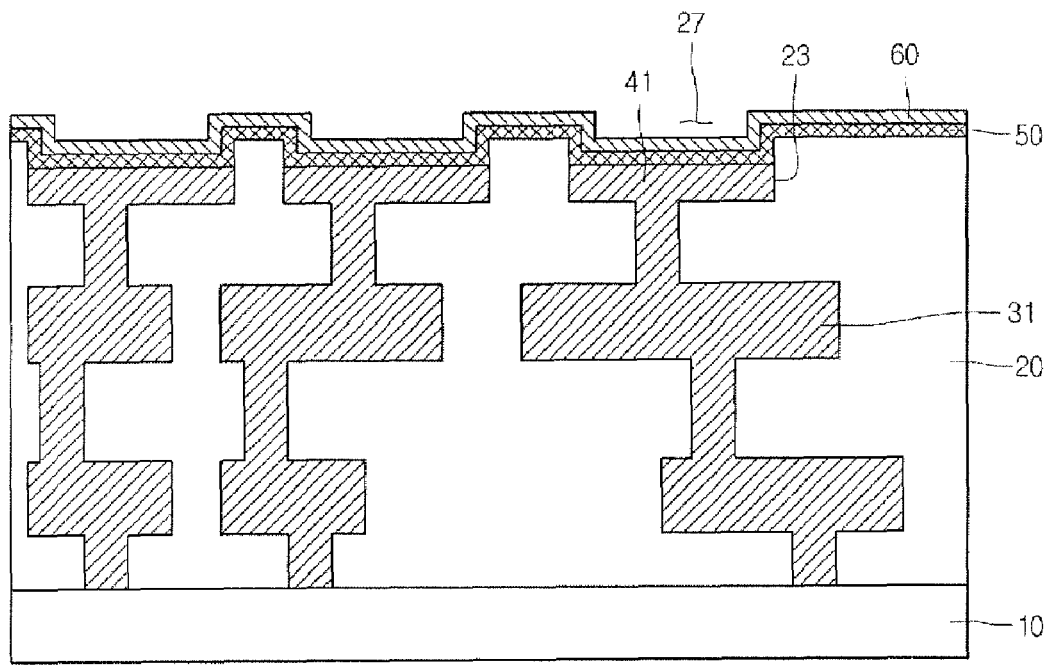

Referring to FIG. 4, a first conductive layer 60 of the photodiode can be formed on the interlayer dielectric layer 20.

It should be noted that the photodiode, which is formed on the upper surface of the interlayer dielectric layer 20 and receives an incident light from the outside to convert and maintain the light into an electrical form, is described in these embodiments as a PIN diode, but embodiments are not limited thereto.

The PIN diode is formed in a structure where an n-type amorphous silicon, an intrinsic amorphous silicon, and a p-type amorphous silicon are bonded. The performance of the photodiode is decided depending on the efficiency of receiving light from the outside and converting it into an electrical form, and total charge capacitance. An existing photodiode structure formed in a substrate generates and stores charge at a depletion region generated in a hetero-junction such as P-N, N-P, N-P-N, and P-N-P. However, the PIN diode, is advantageous in generating and storing the charge, since the entire intrinsic amorphous silicon layer formed between the p-type silicon layer and the n-type silicon layer becomes the depletion region.

When a PIN diode is used as the photodiode, the structure of the PIN diode can be the structure of a P-I-N or a N-I-P. In particular, in the described embodiments, the PIN diode having the P-I-N structure is used by way of an example, and the n-type amorphous silicon is referred to as the first conductive layer 60, the intrinsic amorphous silicon is referred to as the intrinsic layer 70, and the p-type amorphous silicon is referred to as the second conductive layer 80. In other embodiments, a PIM diode can be used. A PIM diode differs from a PIN diode by utilizing a metal layer ("M") instead of an n-type conductive layer ("N"). The metal layer can be any metal that is capable of being silicided at a low temperature, such as not more than 400° C., and preferably not more than 300° C. For example, the metal layer can be formed of Cr, Mo, or W.

As described above, the first conductive layer 60 is formed on the interlayer dielectric layer 20.

The first conductive layer 60 can serve as the "N"-layer of the P-I-N diode. In other words, the first conductive layer 60 can be an N-type conductive layer, but is not limited thereto.

The first conductive layer 60 can be formed by using an n-doped amorphous silicon, but embodiments are not limited thereto.

In other words, the first conductive layer 60 can be formed of, for example, a-Si:H, a-SiGe:H, a-SiC, a-SiN:H, or a-SiO:H by adding germanium, carbon, nitrogen, or oxygen to the amorphous silicon.

The first conductive layer 60 can be formed by a chemical vapor deposition (CVD), such as a plasma enhanced CVD (PECVD). In one embodiment, the first conductive layer 60 can be formed of an n-doped amorphous silicon deposited at a temperature of about 100 to 140° C. using PECVD by mixing $PH_3$ or $P_2H_5$ with silane gas $SiH_4$.

Figure 5:
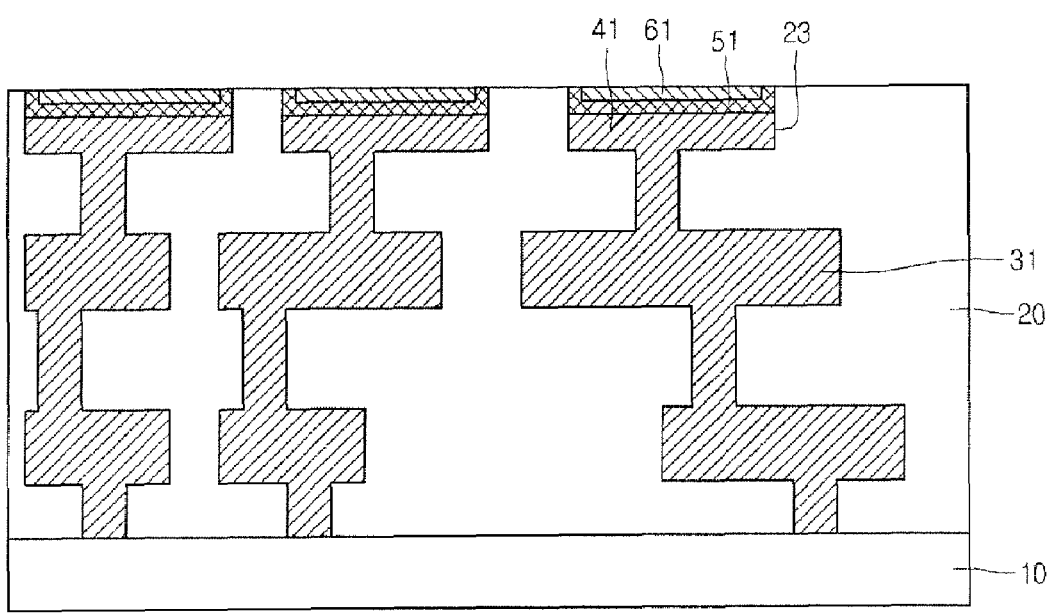

Referring to FIG. 5, the conductive barrier film 50 and the first conductive layer 60 stacked on the upper surface of the interlayer dielectric layer 20 can be removed by means of a CMP process until the upper surface of the interlayer dielectric layer 20 is exposed.

Once the conductive barrier film 50 and the first conductive layer 60 formed on the upper surface of the interlayer dielectric layer 20 are removed, only the conductive barrier film 50 and the first conductive layer 60 stacked in the inside of the trench 23 remain.

Therefore, the inside of the trench 23 of the interlayer dielectric layer 20 can be provided with the metal wiring 41, the conductive barrier film 51, and the first conductive layer 61.

Accordingly the first conductive layer 61 is formed to remain only in the inside of the trench 23 of the interlayer dielectric layer 20 such that the first conductive layer 61 is divided per unit pixel to be insulated from each other.

In an embodiment, the conductive barrier film 51 can be formed in a structure surrounding the upper surface of the metal wiring 41 and the side walls of the trench 23, such that the first conductive layer 61 is formed on only the conductive barrier film 51. The barrier film 51 inhibits the copper of the metal wiring 41 from diffusing to the first conductive layer 61, making it possible to secure the reliability of a device.

After the metal wiring 41, the conductive barrier film 51 and the first conductive layer 61 are formed in the trench 23 of the interlayer dielectric layer 20, a cleaning process can be performed.

The cleaning process can be used to clean the surface of the substrate by means of a plasma gas or cleaning solution.

Figure 6:
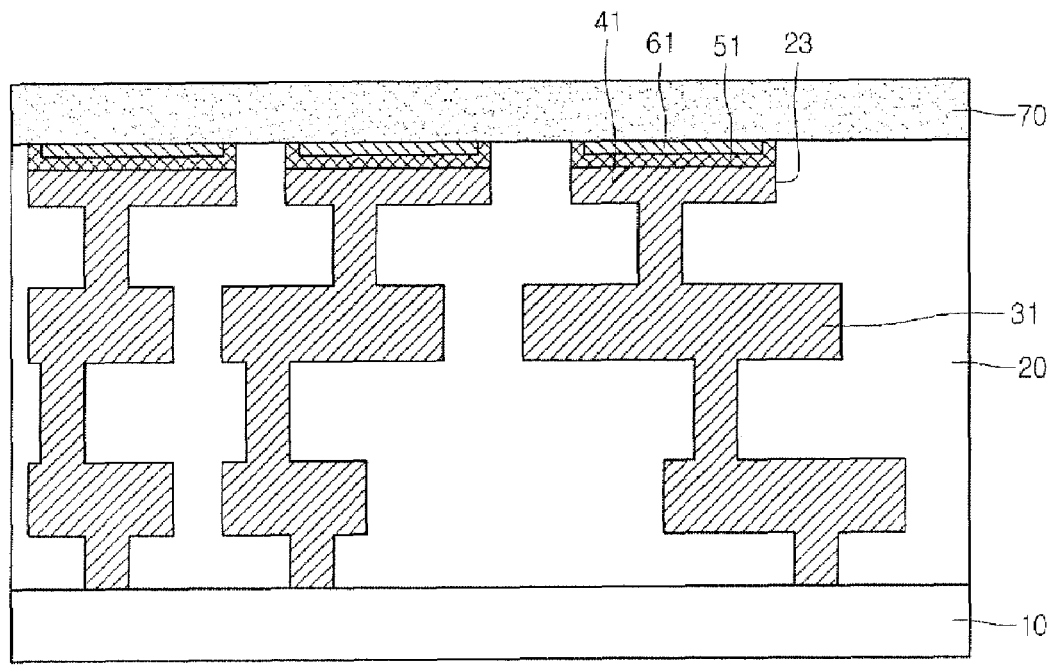

Referring to FIG. 6, an intrinsic layer 70 can be formed on the interlayer dielectric layer 20 including the first conductive layer 61. The intrinsic layer 70 can serve as an "I"-layer of the P-I-N diode.

The intrinsic layer 70 can be formed by using an intrinsic amorphous silicon. The intrinsic layer 70 can be formed by CVD, such as PECVD. For example, the intrinsic layer 70 can be formed of amorphous silicon by PECVD using silane gas $SiH_4$.

Herein, the intrinsic layer 70 can be thickly formed in a thickness of about 10 to 1000 times the thickness of the first conductive layer 61. This is because the depletion region of the photodiode increases in proportion to the thickness of the intrinsic layer 70 to store and generate a large amount of light charge.

Figure 7:
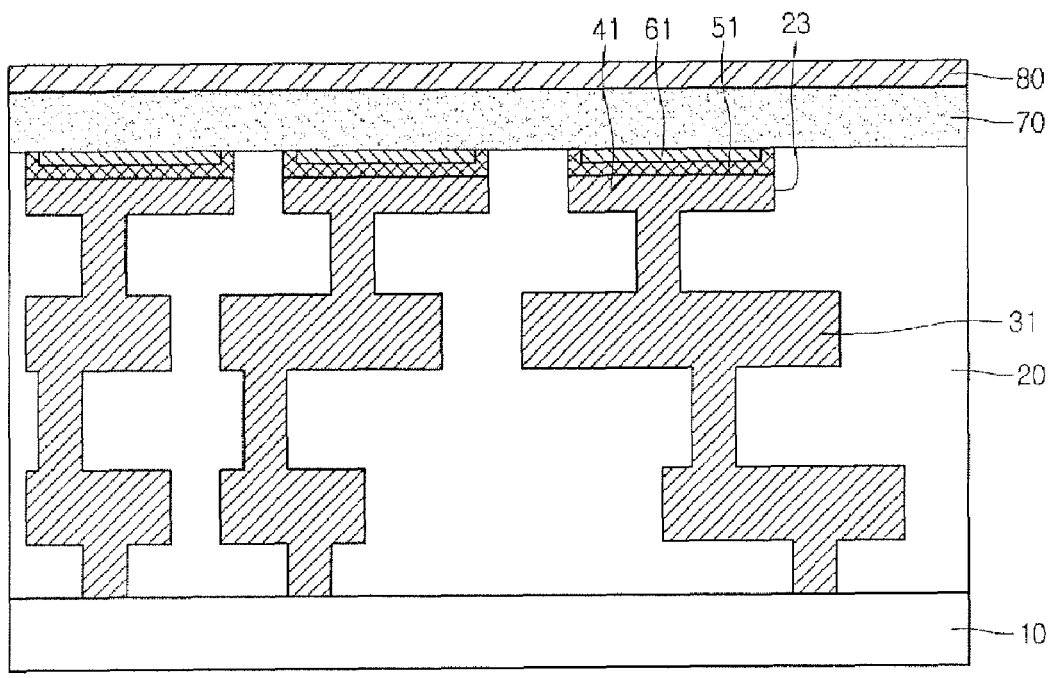

Referring to FIG. 7, a second conductive layer 80 can be formed on the intrinsic layer 70.

The second conductive layer 80 can serve as a "P-layer" of the P-I-N diode. In other words, the second conductive layer 80 can be a P-type conductive layer, but embodiments are not limited thereto.

In an embodiment, the second conductive layer 80 can be formed by using a p-doped amorphous silicon.

The second conductive layer 80 can be formed by CVD, such as PECVD. For example, the second conductive layer 80 can be formed of p-doped amorphous silicon using PECVD by mixing $BH_3$ or $B_2H_6$ with silane gas $SiH_4$.

The embodiments of photodiodes formed by the first conductive layer 61, the intrinsic layer 70, and the second conductive layer 80 as described above are divided per unit pixel since the first conductive layer 61 is formed in the inside of the trench 23 of the interlayer dielectric layer 20.

Referring to FIG. 8, an upper electrode 90 can be formed on the upper surface of the semiconductor substrate 10 on which the photodiode is formed.

The upper electrode 90 can be formed of a transparent electrode having a good light transmission and a high conductivity. For example, the upper electrode 90 can be formed of an indium tin oxide (ITO), cadmium tin oxide (CTO) or $ZnO_2$.

Thereafter, a color filter process and a microlens process can additionally be performed.

Therefore, as provided by the above described embodiments, a photodiode in a P-I-N structure can be formed on the semiconductor substrate, making it possible to provide a vertical type integration of the transistor circuit and the photodiode.

Also, the fill factor can approach 100% by the vertical type integration of the transistor circuit and the photodiode.

Furthermore, it is possible to provide a higher sensitivity than the horizontal type CMOS image sensor in the same pixel size by using the vertical type integration.

In addition, the respective unit pixels can implement a complex circuit without reducing the sensitivity of the image sensor.

By forming the first conductive layer of the photodiode in the inside of a trench of the interlayer dielectric layer, the first conductive layer is divided per unit pixel and secures an insulating property between the unit pixels so that the crosstalk between the pixels is inhibited, thereby making it possible to improve the reliability of the image sensor.

In embodiments, any separate processes for isolating the photodiode per unit pixel is capable of being omitted.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
    forming a top metal wiring in a trench in an interlayer dielectric layer, the top metal wiring electrically connected to a lower metal interconnection on a semiconductor substrate having a transistor circuit formed therein;
    removing at least a portion of the top metal wiring from the trench;
    forming a first conductive layer in the inside of the trench of the interlayer dielectric layer after removing the portion of the top metal wiring from the trench, wherein the first conductive layer is electrically connected to the lower metal interconnection;
    forming an intrinsic layer on the semiconductor substrate including the first conductive layer and the interlayer dielectric layer; and
    forming a second conductive layer on the intrinsic layer.

2. The method according to claim 1, wherein forming the top metal wiring and removing the at least a portion of the top metal wiring from the trench comprises:
    depositing a copper layer in the trench of the interlayer dielectric layer; and
    recessing the copper layer to a depth below the top of the trench by performing a wet etching process.

3. The method according to claim 1, wherein forming the top metal wiring and removing the at least a portion of the top metal wiring from the trench comprises:
    depositing a copper layer in the trench of the interlayer dielectric layer; and
    recessing the copper layer to a depth below the top of the trench by means of a chemical mechanical polishing (CMP) process.

4. The method according to claim 1, wherein the first conductive layer comprises a metal capable of being silicided at a low temperature.

5. The method according to claim 1 wherein forming the first conductive layer comprises depositing a doped amorphous silicon on the semiconductor substrate, including in the trench.

6. The method according to claim 1, further comprising forming a lower electrode on the metal wiring before forming the first conductive layer.

7. The method for fabricating the image sensor according to claim 1, further comprising forming a conductive barrier film on the top metal wiring remaining in the trench after removing the portion of the top metal wiring.

8. The method according to claim 7, further comprising forming a lower electrode on the conductive barrier film before forming the first conductive layer.

9. The method for according to claim 7, wherein forming the conductive film and forming the first conductive layer comprises:
    depositing a material for the conductive barrier film on the interlayer dielectric layer including on the remaining top metal wiring;
    depositing a material for the first conductive layer on the material for the conductive barrier film; and
    etching the material for the conductive barrier film and the material for the first conductive layer to expose the top surface of the interlayer dielectric layer while remaining in the trench.

10. The method according to claim 9 further comprising cleaning the exposed top surface of the interlayer dielectric layer and the first conductive layer.

11. The method according to claim 10 wherein the cleaning comprises using plasma gas or cleaning solution.

* * * * *